US006642538B2

(12) United States Patent
Efros et al.

(10) Patent No.: US 6,642,538 B2
(45) Date of Patent: Nov. 4, 2003

(54) VOLTAGE CONTROLLED NONLINEAR SPIN FILTER BASED ON PARAMAGNETIC ION DOPED NANOCRYSTAL

(75) Inventors: Alexander Efros, Annandale, VA (US); Mervine Rosen, Clifton, VA (US); Emmanuel Rashba, Newton, MA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 10 days.

(21) Appl. No.: 09/983,495

(22) Filed: Oct. 24, 2001

(65) Prior Publication Data

US 2003/0075772 A1 Apr. 24, 2003

(51) Int. Cl.[7] .................. H01L 29/06; H01L 31/0328; H01L 31/0336
(52) U.S. Cl. .............................. 257/30; 257/9; 257/13; 257/14
(58) Field of Search ................. 257/421–427, 257/9, 13–14, 30; 250/306–307; 365/171, 173; 360/324.2; 361/139, 143; 324/207.21, 252; 29/25.01

(56) References Cited

U.S. PATENT DOCUMENTS

| 3,968,376 A | | 7/1976 | Pierce et al. | |
| 4,823,177 A | | 4/1989 | Prinz et al. | |
| 4,835,438 A | | 5/1989 | Baptist et al. | |
| 4,939,363 A | * | 7/1990 | Bando et al. | 250/306 |
| 5,166,919 A | * | 11/1992 | Eigler | 369/126 |
| 5,432,376 A | | 7/1995 | Zambrano | |
| 5,874,749 A | | 2/1999 | Jonker | |
| 6,130,814 A | * | 10/2000 | Sun | 361/143 |
| 6,325,914 B1 | * | 12/2001 | Dediu et al. | 205/688 |
| 6,410,934 B1 | * | 6/2002 | Nayfeh et al. | 257/14 |
| 2002/0011564 A1 | * | 1/2002 | Norris | 250/307 |

OTHER PUBLICATIONS

Dr. Wolf, Technology Thrusts–Magnetic Materials and Devices (Spintronics), Darpa–Defense Sciences Office–DSO, Jun. 8, 2001, p. 1 of 1, www.darpa.mil/dso/texonly/thrust/md/funct_1.htm, 1 page.

Dr. Wolf, Spins (Spins in Semiconductors), Darpa–Defense Sciences Office–DSO, Jun. 8, 2001, p. 1 of 1, www.darpa.mil/dso/thrust/md/funct_9.htm, 1 page.

D.J. Norris, High–Quality Manganese–Doped ZnSe Nanocrystals, Nano Letters, XXXX, vol. 0, No. 0, A–E, Aug. 2, 2000, 5 pages.

* cited by examiner

*Primary Examiner*—Shouxiang Hu
(74) *Attorney, Agent, or Firm*—John J. Karasek; George A. Kap

(57) ABSTRACT

This invention pertains to a device and a method for injecting spin polarized monochromatic electrons with a particular magnetic moment at room temperature and in absence of an external magnetic field into a nonmagnetic electrode. The device comprises a ferromagnetic electrode, a nonmagnetic electrode spaced from the ferromagnetic electrode, a nanocrystal doped with a single active paramagnetic ion disposed in the space between the electrodes, and an electrical connection between the electrodes for applying voltage to move the electrons from the ferromagnetic electrode, through the doped nanocrstal and into the nonmagnetic electrode. The method comprising the step of applying voltage between spaced ferromagnetic and nonmagnetic electrodes whereby spin polarized electrons are passed from the ferromagnetic electrode through a doped nanocrystal that is spaced from the ferromagnetic electrode and is in contact with the nonmagnetic electrode, and into the nonmagnetic electrode, the nanocrystal being doped with a single paramagnetic ion.

8 Claims, 1 Drawing Sheet

VOLTAGE CONTROLLED NONLINEAR SPIN FILTER BASED ON PARAMAGNETIC ION DOPED NANOCRYSTAL

BACKGROUND OF THE INVENTION

1. Field of the Invention

This invention pertains to injection of spin polarized electrons into a nonmagnetic material at room temperature and in absence of an external magnetic field.

2. Description of Related Art

The relatively new field of spin electronics or spintronics is based on the spin of an electron rather than its charge, as is the case for all conventional electronics.

The spin of an electron has been mainly ignored, although it represents a powerful new way to build electronic devices—spintronics. Instead of controlling the flow of charge, spintronic devices operate by manipulating both direction of the spin and the electron charge. Potential for spintronics is not only for very high speed, very low power systems for computation and communication, but for some applications which have not yet been conceived.

Some major discoveries have been made recently that will revolutionize electronics of the future. A very long lived collective and coherent spin state has been formed by shining circularly polarized light on conventional semiconductors like silicon, gallium arsenide, gallium nitride, etc. In addition, ferromagnetism was discovered in GaMnAs at 120 K, which opens the door to even higher temperature ferromagnetic semiconductors.

The combination of new discoveries will make new paradigms of spintronic devices for opto-electronics and very high performance logic, memory and perhaps quantum computation and communication on more traditional materials than the spintronic devices.

Coherence has been observed to persist over hundreds of nanoseconds and for distances of hundreds of microns. This indicates that this coherent state can be utilizes to carry and process the spin information which may be the basis for a new paradigm in electronics. An experiment performed on a nanoparticle quantum dot indicates that a coherent spin state consisting of a very few electrons can persist for long times in these nanostructure quantum dots even at room temperature.

One of the major challenges of semiconductor spintronics is the ability to transfer spin information across boundaries between different semiconductors. A recent experiment illustrates that in the case of a GaAs/ZnSe boundary, the transfer process proceeds without much difficulty and spin dependent information is transferred across quickly and with high fidelity. Such an experiment can lead the way to a more complete understanding of the spin dependent properties of semiconductors.

There are three areas that will definitely be impacted by spintronics. The first is Quantum Spin Electronics, which refers to devices that are more conventional but can be enhanced by adding the spin degree of freedom to their operation. Such devices include spin transistors, spin-LEDs, spin-resonant tunneling diodes and perhaps even spin lasers. The second area is Coherent Spin Electronics and it takes advantage of the special coherence that was discovered recently. In this second case, devices that might be built are optical switches, encoders, decoders, modulators, phase logic and perhaps phase memory. The third and final area is Quantum Information Processing and involves using the coherent spin state to perform quantum mechanical operations for the exotic field of quantum computing and quantum communications, perhaps enabling something like a quantum internet in the no-too-distant future.

The invention disclosed and claimed herein is believed to pertain mostly to the first area identified as Quantum Spin Electronics.

Room temperature transfer of spin polarized electrons with efficiency of about 2% is exemplified in literature articles by P. R. Hammer et al in *Phys. Rev. Lett.* 83, 203 (1999); by S. Gardalic et al in *Phys. Rev. B* 60, 7764 (1999); and by H. J. Zhu et al in *Phys. Rev. Lett.* 87, 016601 (2001). Transfer of spin polarized electrons in an external magnetic field and at very low temperature of about −270° C. with efficiency exceeding 50% is exemplified in literature articles by R. Fiederlins et al in *Nature* 402, 790 (1999); by Y. Ohno et al in *Nature* 402, 790 (1999); and by B. T. Jonker et al in *Appl. Phys. Lett.* 77,3989 (2000).

OBJECTS AND BRIEF SUMMARY OF THE INVENTION

An object of this invention is the injection, at room temperature and in absence of an external magnetic field, of spin polarized monochromatic (same energy) electrons of a particular magnetic moment from a ferromagnetic electrode through a nanocrystal doped with a paramagnetic ion and into a nonmagnetic electrode, with applied voltage between the ferromagnetic and the nonmagnetic electrodes.

Another object of this invention is the control of injection of spin polarized electrons from a ferromagnetic to a nonmagnetic materials, this control includes enhancing or suppressing injection thereof and changing sign of the spin injection coefficient which equals to the ratio of the difference between currents of electrons with spin up and spin down projections to the sum of these currents.

Another object of this invention is alignment of the magnetic moment of the paramagnetic ion residing in the nanocrystal as a result which, the doped nanocrystal acts as a spin filter to pass only an electron with a particular spin projection, thus either enhancing or suppressing spin polarization of the current.

Another object of this invention is the injection of spin polarized electrons at room temperature and in absence of an external magnetic field.

Another object of this invention is the filtering of the spin polarized electron current with efficiency of up to 100%, which can result in enhancement of up to several times in the spin injection coefficient relative to that in the absence of the doped nanocrystal.

These and other objects of this invention can be attained by a device and a method for injecting spin polarized electrons. The device includes spaced ferromagnetic and nonmagnetic electrodes with a nanocrystal doped with a single paramagnetic ion disposed between and connected with the ferromagnetic and nonmagnetic electrodes by tunneling contact, with leads between the electrodes for applying voltage. The method for injecting spin polarized electrons at room temperature and in absence of an external magnetic field includes the step of transferring spin polarized electrons under influence of applied voltage from a ferromagnetic electrode, into nanocrystal doped with a single paramagnetic ion and finally, from the doped nanocrystal into a nonmagnetic electrode.

DETAILED DESCRIPTION OF THE INVENTION

This invention pertains to a device and a method for injecting spin polarized electrons at room temperature and in absence of an external magnetic field into a nonmagnetic material where there may have been none to begin with. This invention provides an effective source of monochromatic, spin polarized electrons which are injected, under applied voltage, from a ferromagnetic electrode to a nonmagnetic electrode through a doped nanocrystal disposed between and connected by tunnel contacts to the ferromagnetic electrode and to the nonmagnetic electrode.

Figure 1:
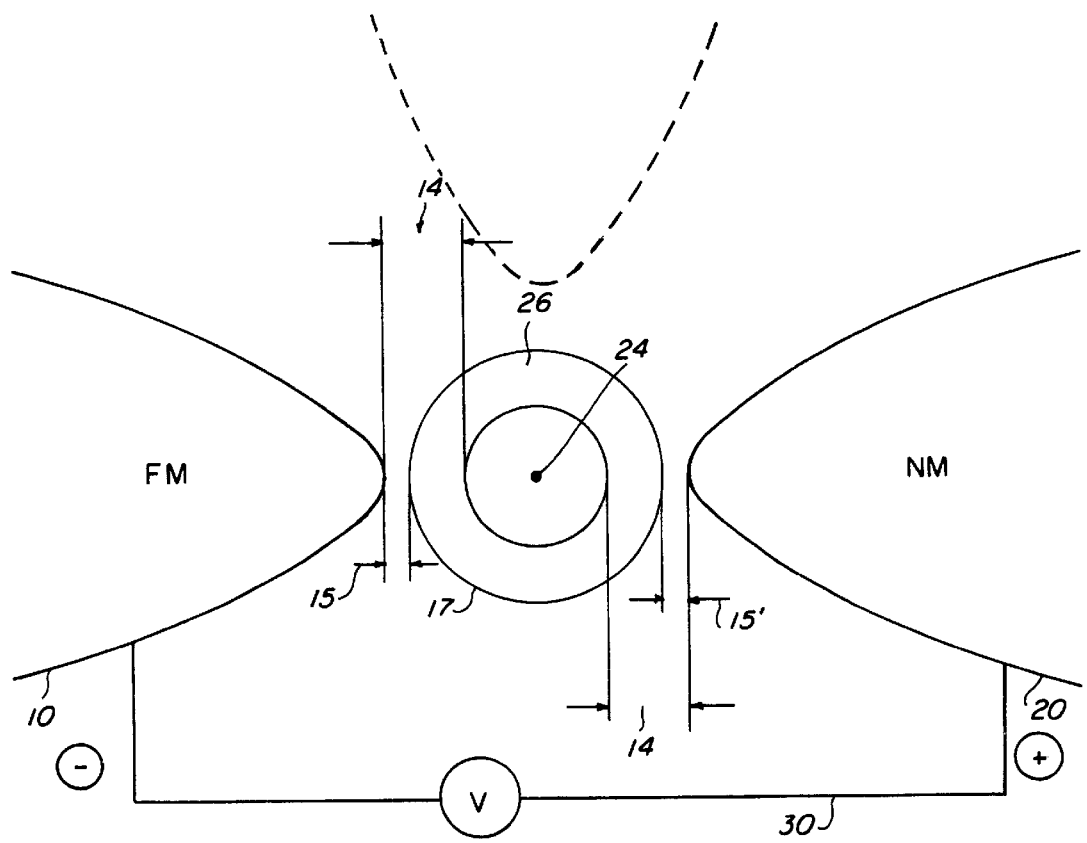
FIG. 1 illustrates the device for injecting spin polarized electrons from a ferromagnetic electrode, through a doped nanocryatal, and then into a nonmagnetic electrode, under the influence of applied voltage.
Figure 2:
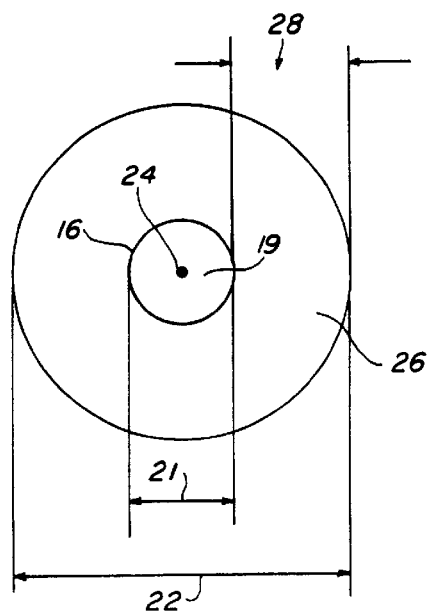
FIG. 2 illustrates the doped nanocrystal in greater detail.

The device is schematically illustrated in FIG. 1 which shows a ferromagnetic (FM) electrode 10 spaced a gap distance 15 from but which is in tunnel contact with a doped nanocrystal 17. The ferromagnetic electrode 10 can be a tip of a scanning tunneling microscope (STM) having an apex through which the electrons tunnel from electrode 10 to the nanocrystal 17. The nanocrystal 17 is in tunnel contact on with the nonmagnetic (NM) electrode 20. The nanocrystal 17, as illustrated in FIG. 2, has outside diameter 22 and is doped with a single paramagnetic ion 24 that is typically disposed at about the center of each nanocrystal. The nanocrystal 17 is coated with a passivating material coating 26 whose thickness is 28. The passivating material 26 coats each nanocrystal completely. The coating material can form a natural tunneling barrier. It is the passivating material 26 and the space between the nanocrystal and the nonmagnetic electrode that form a natural or artificial tunneling barrier with the electrode 20 respectively that provides indirect contact between the active portion 16 of the nanocrystal 17 and the semiconducting electrode 20. Outside diameter of the active portion of the nanocrystal 17 is 21.

The paramagnetic ion 24 in the nanocrystal 17 provides what may be referred as the "internal" magnetic field as opposed to the "external" magnetic field of the prior art.

The electrons from the ferromagnetic electrode 10, after tunneling through the barrier formed by gap 15 and coating 26, enter the doped nanocrystal 17 and then again through tunnel barrier which includes the coating 26 and the gap 15' into the electrode 20 where the electrons can be optically detected through their contribution to fluorescence. The coating 26 is of a passivating material and acts as a natural tunneling barrier and as an electrical path for the electrons which tunnel through the passivating coating, thus providing tunneling contact between the electrodes and the nanocrystal. Voltage potential is applied between electrodes 10, 20 by means of electrical connection 30 to cause spin polarized current, and therefore spin polarized electrons to flow from electrode 10, through gap 15 through the coating 26 of the doped nanocrystal 17, through gap 15' and into electrode 20, wherefrom the transferred electrons can be collected and harnessed in a known way. In a particular embodiment of the invention, a third electrode can be used as a gate, as shown in dotted outline in FIG. 1.

The mechanism for adjusting the ferromagnetic electrode with respect to the doped nanocrystal is not shown for the case where the ferromagnetic electrode is scanning tunneling microscope tip. This mechanism typically involves a piezoelectric cell for determining location of the doped nanocrystal.

Although not illustrated, another aspect of this device is the control of the energy of the levels in the nanocrystal relative to the Fermi energy levels in the electrodes which takes place when a voltage is applied between the ferromagnetic and the nonmagnetic electrodes, with the doped nanocrystal disposed therebetween.

Ferromagnetic material exhibits ferromagnetism that is a property exhibited by certain metals, alloys, and compounds of the transition (iron group) rare-earth and actinide elements, in which the internal magnetic moments spontaneously organize in a common direction and give rise to spontaneous magnetic moment. Generally, examples of ferromagnetic materials include the various forms of iron, steel, cobalt, nickel, and their alloys. Specific examples of ferromagnetic materials suitable herein include cobalt; iron; alloys of cobalt and iron, such as $Co_{90}Fe_{10}$; and alloys of nickel and iron.

The electrode 20 can be made of semiconducting materials and nonmagnetic metals. A semiconductor is a solid crystalline material whose electrical conductivity is intermediate between that of a conductor and an insulator, ranging from about $10^5$ mhos to $10^{-7}$ mho per meter, and is usually strongly temperature dependent. Examples of suitable semiconducting materials include gallium arsenide (GaAs), silicon (Si), germanium (Ge), indium arsenide (InAs), gallium phosphide (GaP), and their alloys. The nonmagnetic metals include noble metals such as silver, gold, and platinum; lead, zinc, and the like.

The only requirement on the nanocrystal is that it be small and that it can be doped with a single paramagnetic ion. Examples of active nanocrystal materials suitable herein include cadmium sulfide (CdS), zinc sulfide (ZnS), zinc selenide (ZnSe), indium arsenide (InAs), and cadmium telluride (CdTe).

The purpose of the passivating coating forming the outside surface of the nanocrystal is to provide stability to the nanocrystal by isolating the surface of the active portion of the nanocrystal from the effects the environment. This passivating coating also serves as a natural tunneling barrier. Examples of passivating coatings or ligands suitable herein include trioctylphosphine, trioctylphosphine oxide, tributylphosphine, tributylphosphine oxide, oleic acid, stearic acid, hexadecylamine, oleyl amine, pyridine, pyrazine, tricetylphosphate, propanethiol, hexanethiol, hexadecanethiol, and the like.

The paramagnetic ion should have a large magnetic moment in order to align the incoming spin polarized electrons. Magnetic moment of the paramagnetic ion should be in excess of ½ and typically in the range of 5/2 to 7/2 but can be as large as possible. Examples of suitable paramagnatic ions include manganese ions ($Mn^{+2}$) and gadolinium ions ($Gd^{+3}$).

Outside diameter 22 of the nanocrystal 17 is 2–10 nm; passivating coating thickness 28 is 5–25% of the outside diameter of the doped nanocrystal, and is typically on the order of about 5 Å; applied voltage through lead or electrical connection 30 can be anything from greater than zero to a high voltage that results in breakdown, or more typically in the range of −3 to +3 volts, particularly 0.2–1 volt; and the corresponding spin polarized current is typically from −2 nA to +2 nA, particularly 0.5–1 nA.

The method for injecting spin polarized electrons into the nonmagnetic material is provided by applied voltage, at room temperature and in absence of an external magnetic field, from a ferromagnetic electrode, through the doped nanocrystal and finally into the nonmagnetic electrode. This injection is accomplished by spin filtering. Due to small size of the nanocrystal, this allows the proposed device to comply with the basic concept of spintronics pertaining to miniaturization of devices.

Spin polarized current consisting of spin polarized electrons with up or down magnetic moments provides orientation for the magnetic moment of the paramagnetic ion. Degree of the current spin polarization increases with the applied voltage and it is controlled by the voltage applied between the ferromagnetic and the nonmagnetic electrodes. The degree of magnetization of the paramagnetic ion, i.e., its magnetic moment, also increases with applied voltage.

The applied voltage does not change the electron spin polarization degree in the ferromagnetic electrode. Varying this voltage, however, strongly influences the degree of the current spin polarization passing the doped nanocrystal.

The spin polarized electrons injected from the ferromagnetic electrode into the doped nanocrystal align the magnetic moment of the paramagnetic ion. Stationary magnetization of the paramagnetic ion depends on the spin polarized current passing through the nanocrystal. The typical times necessary to reach this stationary value are shorter than 1 nanosecond. The polarization of the ions, in turn, controls the spin polarization of the current flowing through the nanocrystal. When the paramagnetic ion is aligned, the device acts as a filter for passing electrons of certain spin projection. This is made possible by the energy splitting of the electron spin levels into the ground state and the excited state caused by the very large or giant exchange (magnetic) field of the paramagnetic ion. With manganese ion ($Mn^{+2}$) as the paramagnetic ion, the energy split between the ground state and the excited state can be as large as 250 meV. In absence of a paramagnetic ion in the nanocrystal, the energy split does not take place. Assuming that the Fermi energy level in the ferromagnetic electrode is between two electron spin states in the doped nanocrystal, all electrons pass through only the ground state of the nanocrystal and as a result the electrons become spin polarized.

The energy split is paramount to the success of this device and method of its operation. The energy split enhances the spin selectivity of electrons passing through the doped nanocrystal thus enhancing the spin injection coefficient.

The Fermi energy level in the ferromagnetic electrode is between the excited and the ground spin states of the nanocrystal while the Fermi level in the nonmagnetic electrode is below the ground spin state of the nanocrystal. The splitting of the electron spin states in the doped nanocrystal should be larger than the room temperature energy (26 meV) in order to operate at room temperature. Relative position of the Fermi energy can be changed by adjusting applied voltage. Adjustment of the Fermi energy may be desirable since transfer of the electrons is effected by the Fermi energy positions.

As earlier noted, the spin polarized electrons tunneling to the nanocrystal from the ferromagnetic electrode have the degree of spin polarization that depends on the ferromagnetic material. By changing the ferromagnetic material, it is possible to change the spin injection coefficient in the nonmagnetic electrode.

Therefore, this device and method for injection of monochromatic spin polarized electrons of a particular magnetic moment can lead to the spin injection coefficient, which is increased several fold.

Having described the invention, the following example is given as particular embodiment thereof and to demonstrate the practice and advantages thereof. It is understood that the example is given by way of illustration and is not intended to limit the specification or the claims in any manner.

EXAMPLE 1

This example demonstrates the use and operation of the device of this invention at room temperature of about 20° C., at standard conditions and in absence of an external magnetic field.

Referring to FIG. 1, the ferromagnetic electrode 10 is $Co_{90}Fe_{10}$, an alloy of cobalt and iron. The gap distance 15 is 5 Å forming the artificial tunneling barrier. The nanocrystal 17 outside diameter is 35 Å (3.5 nm) and the passivating coating or ligand 26 is trioctylphosphine oxide and its thickness is 5 Å. The active nanocrystal material 19 is zinc selenide and its outside diameter is 25 Å. The paramagnetic ion 24 is manganese ion. The nonmagnetic electrode 20 is gallium arsenide. The splitting of the electron spin levels in the nanocrystal is 250 meV. The second gap distance 15' is zero and the tunneling barrier is formed by the passivating coating layer 26.

Application of 1 volt to the electrodes separated by a tunnel barrier without the nanocrystal in the FIG. 1 device, leads to a spin injection coefficient of about 8%, based on our estimation, whereas with the doped nanocrystal, this coefficient is about 21%. This represents an enhancement of the spin polarization of the injection current by a factor of almost 3.

While presently preferred embodiments have been shown of the novel device for injecting spin polarized electrons, and of the several modification discussed, persons skilled in this art will readily appreciate that various additional changes and modification may be made without departing from the spirit of the invention as defined and differentiate by the following claims.

What is claimed is:

1. A device for injecting spin polarized monochromatic electrons of a particular magnetic moment at room temperature and in absence of an external magnetic field into a nonmagnetic electrode, comprising a ferromagnetic electrode, said nonmagnetic electrode spaced from said ferromagnetic electrode, a nanocrystal doped with a single paramagnetic ion disposed in the space between said electrodes and in tunneling contact with said electrodes, and an electrical connection to said electrodes for applying voltage to move the electrons from said ferromagnetic electrode, through said doped nanocrystal and into said nonmagnetic electrode.

2. The device of claim 1 wherein said ferromagnetic electrode comprises a tip of a scanning tunneling microscope.

3. The device of claim 1 wherein said doped nanocrystal includes a passivating coating enveloping an active portion which includes said paramagnetic ion, said passivating coating serves as said tunneling contact between said electrodes and said nanocryatal.

4. The device of claim 3 wherein said ferromagnetic electrode comprises cobalt, iron, alloys of cobalt and iron, or alloys of nickel and iron; said passivating coating comprises trioctylphosphine, trioctylphosphine oxide, tributylphosphine, tributylphosphine oxide, oleic acid, stearic acid, hexadecylamine, oleyl amine, pyridine, pyrazine, tricetylphosphate, propanethiol, hexanethiol, hexadecanethiol, or mixtures thereof; said active portion of said doped nanocrystal comprises cadmium sulfide, zinc sulfide, zinc selenide, indium arsenide, cadmium telluride, and mixtures thereof; said nonmagnetic electrode comprises gallium arsenide, silicon, germanium, indium arsenide, gallium phosphide, or alloys thereof, noble metals, lead, or zinc.

5. The device of claim 4 wherein said ferromagnetic electrode is spaced from said doped nanocrystal by a tunneling contact gap distance of 5–20 Å, said doped nanocrystal has an outside diameter of 2–10 nm, and thickness of said passivating coating on said active portion of said doped nanocrystal is 5–25% of the outside diameter of said doped nanocrystal.

6. The device of claim 5 including a third electrode in the vicinity of said doped nanocrystal which changes voltage drop between said ferromagnetic and nonferromagnetic electrodes.

7. The device of claim 6 wherein applied voltage on said nonferromagnetic and said nonmagnetic electrodes is from −3 to +3 volts.

8. The device of claim 7 wherein said ferromagnetic electrode comprises an alloy selected from the group consisting of cobalt and iron and nickel and iron; said passivating coating comprises trioctylphosphine oxide; said active portion of said doped nanocrystal comprises zinc selenide; said paramagnetic ion has magnetic moment in the range of from 5/2 to 7/2 and is selected from the group consisting of manganese ion ($Mn^{+2}$) and gadolinium ion ($Gd_{+3}$); and said nonmagnetic electrode comprises gallium arsenide.

* * * * *